(12) United States Patent
Sparano

(10) Patent No.: US 6,504,878 B1
(45) Date of Patent: Jan. 7, 2003

(54) DIGITALLY MODULATED RF AMPLIFIER SYSTEM HAVING IMPROVED ADJACENT SIDEBAND DISTORTION REDUCTION

(75) Inventor: David Andrew Sparano, Quincy, IL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/292,637

(22) Filed: Apr. 15, 1999

(51) Int. Cl.[7] .................. H04L 25/03; H04B 15/00; H04B 1/04
(52) U.S. Cl. ................. 375/297; 375/285; 332/123; 455/114
(58) Field of Search .................. 375/295, 296, 375/297, 224, 254, 284, 285; 330/149; 455/63, 67.1, 67.3, 91, 112, 114, 115, 118, 119, 127; 332/100, 103, 107, 123, 124, 144, 145, 149, 155

(56) References Cited

U.S. PATENT DOCUMENTS

| | | | | |
|---|---|---|---|---|
| 3,831,094 A | * | 8/1974 | Stover | 455/119 |
| 4,025,855 A | * | 5/1977 | Atkinson | 455/109 |
| 4,363,132 A | * | 12/1982 | Collin | 455/505 |
| 5,339,054 A | * | 8/1994 | Taguchi | 332/100 |
| 5,633,893 A | * | 5/1997 | Lampe et al. | 375/297 |
| 6,108,385 A | * | 8/2000 | Worley, III | 375/296 |

* cited by examiner

*Primary Examiner*—Betsy L. Deppe
(74) *Attorney, Agent, or Firm*—Tarolli, Sundheim, Covell, Tummino & Szabo L.L.P.

(57) ABSTRACT

A digitally modulated RF amplifier system is presented having improved adjacent sideband distortion reduction. This system includes the provision of a first RF carrier signal at a first frequency within a first frequency channel having adjacent channels. A modulator receives a digital information signal and modulates the first RF carrier signal with the digital information signal to provide a digitally modulated RF signal within the first RF channel. A second RF carrier signal is provided having a second frequency spaced from the first frequency channel by a frequency that is greater than the bandwidth of the first channel. The digitally modulated RF signal is combined with the second RF carrier signal to provide a combined RF signal which is then amplified resulting in an amplified RF signal having reduced adjacent sideband distortion products. The amplified RF signal is then applied to a bandpass output filter for removing the second carrier signal and other signals that are of frequencies which are outside of the first channel and its adjacent channels.

36 Claims, 2 Drawing Sheets

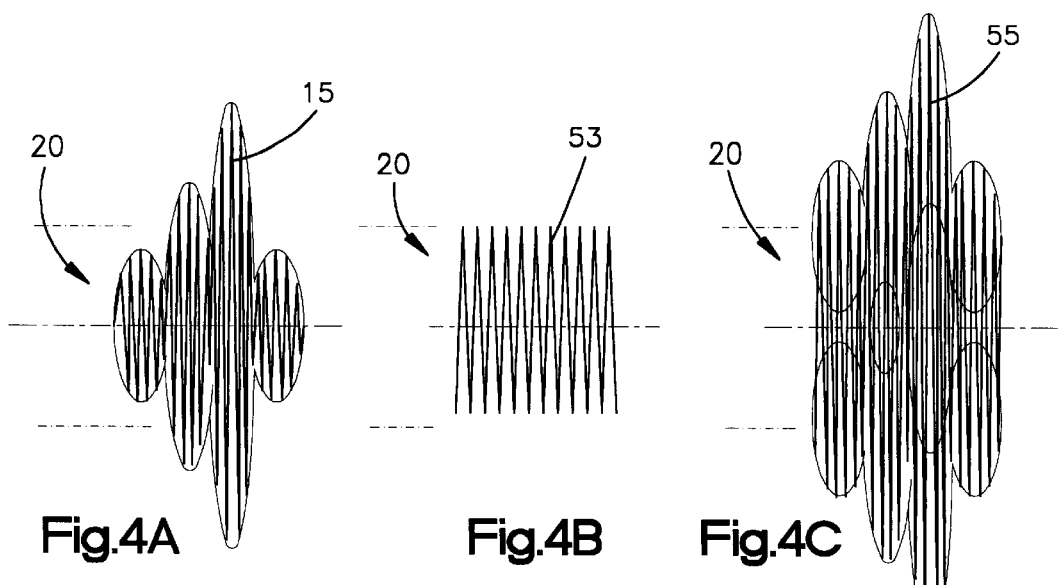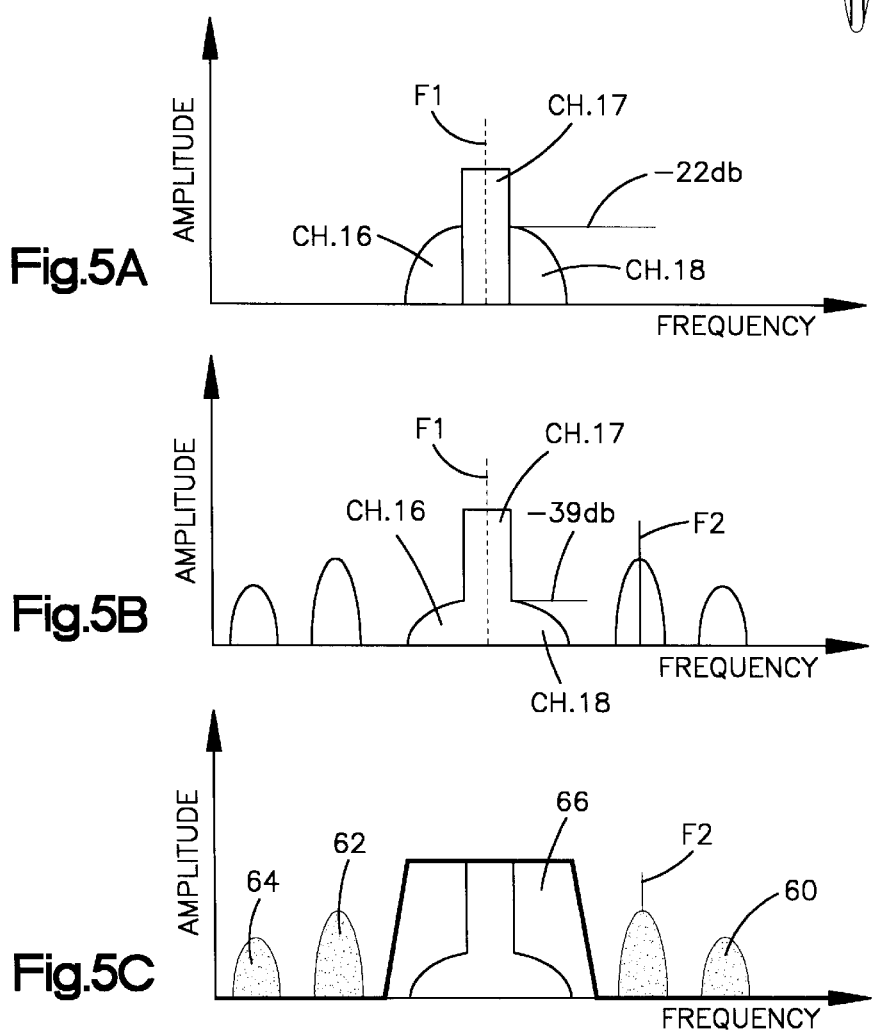

DIGITALLY MODULATED RF AMPLIFIER SYSTEM HAVING IMPROVED ADJACENT SIDEBAND DISTORTION REDUCTION

TECHNICAL FIELD

The present invention relates to RF communication systems and is particularly directed to a digitally modulated RF amplifier system having means for compensating for distortion falling into the RF channels immediately adjacent to the assigned RF channel.

BACKGROUND OF THE INVENTION

Modern digital RF communication systems, with complex modulation envelopes, place stringent demands on RF power amplifier linearity. If a RF power amplifier does not possess excellent AM—AM and AM–PM linearity, the digital RF envelope will suffer distortion during amplification and intermodulation will result. One result of signal intermodulation occurring in the power amplifier is the generation of spurious spectral components falling into the RF channels immediately adjacent to the assigned RF channel. This phenomenon is sometimes referred to as "spectral spreading" or "spurious sidebands". This effect is to be minimized since it represents an unwelcome distortion to those using an adjacent RF channel for their communication purposes.

Amplifier non-linearities may occur at any point in the power amplifier transfer curve. One area of special interest is very low signal level distortions caused by the exponential turn-on (near the zero crossing level) nature of the amplifying device. Digital modulation schemes, such as DTV (8-VSB), DVB (COFDM), and QAM, with frequent envelope zero crossings rely heavily on the linear amplification of those low signal levels near the zero carrier level. Traditional diode-threshold based correction schemes do not work well at these low RF signal levels because of the turn-on behavior of the diodes themselves.

It has long been known that many class AB amplifiers suffer from gross phase and amplitude non-linearities in their low-power turn-on regions. In NTSC/PAL television this was not a serious problem since most of these turn-on non-linearities fell at or above 100 IRE on the RF transfer curve. These distortions were not in the "active picture" part of the RF signal and, as a result, ignored by traditional linearity and ICPM tests. With DTV, these turn-on non-linearities pose very serious problems since the DTV signal spends a great deal of time around the zero-crossing region of the RF transfer curve.

SUMMARY OF THE INVENTION

The present invention is directed toward improvements in reducing adjacent sideband distortion in a digitally modulated RF amplifier system. As will be brought out in greater detail hereinafter, the improvement contemplates employing a second carrier frequency spaced from that of the main or assigned RF channel.

In accordance with the present invention, a digitally modulated RF amplifier system is provided having improved adjacent sideband distortion reduction. This system includes the provision of a first RF carrier signal at a first frequency within a first frequency channel having adjacent channels. A modulator receives a digital information signal and modulates the first RF carrier signal with the digital information signal to provide a digitally modulated RF signal within the first RF channel. A second RF carrier signal is provided having a second frequency spaced from the first frequency channel by a frequency that is greater than the bandwidth of the first channel. The digitally modulated RF signal is combined with the second RF carrier signal to provide a combined RF signal which is then amplified resulting in an amplified RF signal having reduced adjacent sideband distortion products. The amplified RF signal is then applied to a bandpass output filter for removing the second carrier signal and other signals that are of frequencies which are outside of the first channel and its adjacent channels.

BRIEF DESCRIPTION OF THE DRAWINGS

The foregoing and other features of the present invention will become apparent to those skilled in the art to which the present invention relates upon reading the following description with reference to the accompanying drawings, wherein:

FIG. 4 which includes FIGS. 4A, 4B and 4C, are graphical illustrations of amplitude with respect to time illustrating the digitally modulated RF signal together with a second RF carrier signal which when added together (FIG. 4C) provides a combined RF signal.

FIG. 5 is comprised of FIGS. 5A, 5B and 5C, which are graphical illustrations of waveforms of amplitude with respect to frequency and which are helpful in describing the invention herein.

DESCRIPTION OF PREFERRED EMBODIMENTS

Figure 1:
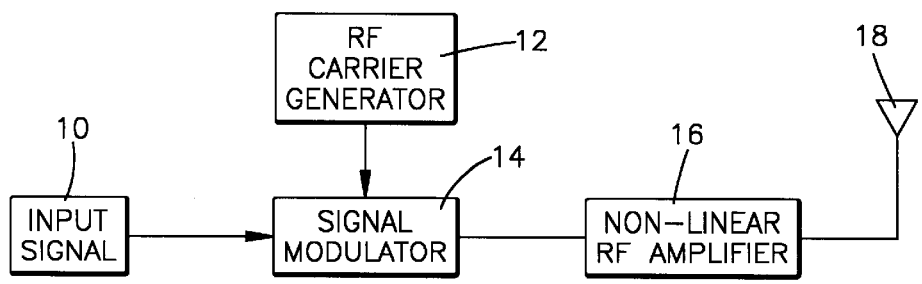
FIG. 1 is a block diagram illustration of a typical prior art RF amplifier system.

Reference is now made to FIG. 1 which illustrates a typical RF amplifier system known in the prior art. In this example, an input information signal from a source 10 is employed for purposes of modulating an RF carrier signal from RF carrier generator 12 at a signal modulator 14. The modulated RF signal is then applied to a non-linear RF amplifier 16 and the amplified RF signal is then supplied to an antenna 18 for transmitting the signal.

Figure 3:
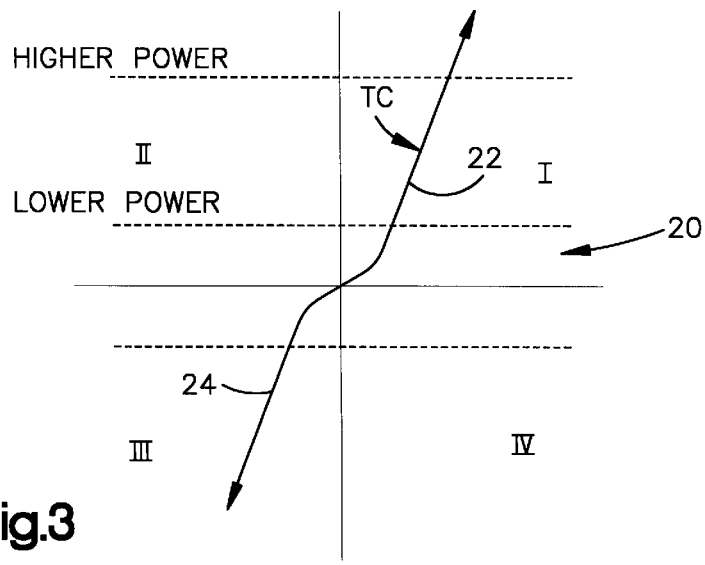
FIG. 3 is a graphical illustration of an amplifier transfer curve showing power in versus power out.

Reference is now made to FIG. 3 which illustrates the amplifier transfer curve of the non-linear RF amplifier 16. This transfer curve (TC) has a non-linear region 20 near the zero crossing level. This non-linear region has a "bump" in between linear portions 22 and 24 which are respectively located in quadrants I and III of FIG. 4. Due to this non-linearity in the turn-on region 20 of the transfer curve, the digital RF envelope will suffer distortion during amplification and intermodulation will result. This causes spurious spectral components that fall into the RF channels immediately adjacent to the assigned RF channel. Thus, for example, the input signal 10 is a digital signal serves to digitally modulate an RF carrier signal to provide a DTV signal to the amplifier 16. The assigned DTV channel may, for example, be channel 17 which extends from 488 MHz to 494 MHz. The adjacent channels are channels 16 and 18. Channel 16 extends from 482 MHz to 488 MHz, whereas channel 18 extends from 494 MHz to 500 MHz.

Reference is now made to FIG. 5A which illustrates the assigned channel 17 together with the adjacent channels 16 and 18. Because of the non-linear turn-on region there is significant distortion in channels 16 and 18 and this is sometimes referred to as "spectral spreading" or "spurious sidebands". This is to be minimized because it represents an unwelcome distortion to those using the adjacent RF channels.

Digital modulation schemes such as DTV (8-VSB), DVB (COFDM), and QAM have frequent envelope zero crossings and rely heavily on the linear amplification of low level signals near the zero crossing level within the non-linear turn-on region 20 (FIG. 3). Operation in this region results in the low signal level distortions caused by the exponential turn-on nature of the amplifying device resulting in the sideband distortions shown in the adjacent channels 16 and 18 in FIG. 5A.

Some specifications require that the adjacent sidebands resulting from distortion be at least at −37 dB for all power levels of the amplifier. Whereas this specification may be achievable when the non-linear power amplifier 16 is operating at full RF output power level, it may be very difficult to achieve during operation at a reduced power level, because the non-linear portion 20 of the transfer curve TC is greater in proportion to the reduced amplitude RF signal.

For example, a given amplifier was measured to have adjacent channel sidebands of −34 dB when operating at its full nominal power of 225 watts. This amplifier was close to meeting the required −37 dB specification at the 225 W power level. The same amplifier had a sideband distortion level of only −22 dB when operated at the reduced power level of 25 watts. It was clearly far from meeting the −37 dB specification (valid for all power levels) when operating at this reduced power.

Figure 2:
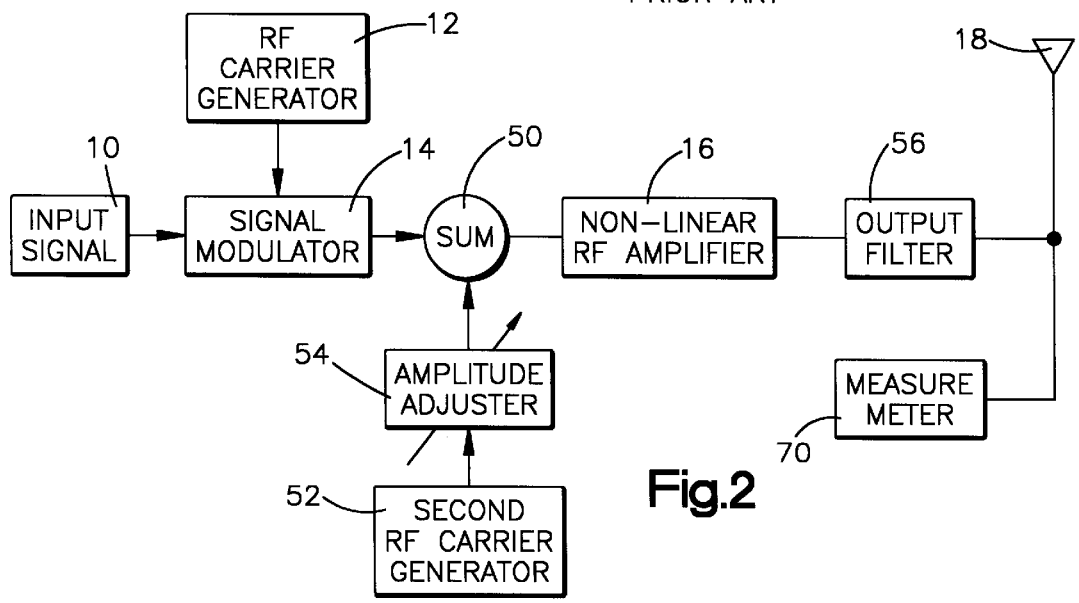
FIG. 2 is a block diagram illustration of a digitally modulated RF amplifier system in accordance with the present invention.

Improvement in distortion reduction is achieved in accordance with the present invention by the circuit as illustrated in FIG. 2 to which attention is now directed. To simplify the description herein, components in FIG. 2 that are similar to those in FIG. 1 are identified with the same reference numbers. Thus, the digital information input signal supplied from an input signal source 10 is applied to a signal modulator 14 which receives a first RF carrier frequency signal F1 from an RF carrier generator 12. The input signal 10 serves to digitally modulate the carrier signal at the modulator 14 and provide a digitally modulated RF signal to a summation circuit 50. A second RF carrier generator 52 provides a second carrier frequency signal F2 to the summation circuit 50 by way of an amplitude adjuster 54. Adjuster 54 may be manually adjustable for varying the magnitude of the second carrier signal. The first carrier frequency signal $F_1$, is preferably within an assigned DTV channel, such as channel 17, which extends from 488 MHz to 494 MHz. The width W of each channel 16, 17 and 18 is 6 MHz.

The second carrier signal, $F_2$, provided by generator 52, is preferably spaced from the assigned channel 17 by a frequency of at least 3 W and preferably about 5 W. Thus, the second carrier signal is spaced about 30 MHz from channel 17. This may be at a frequency less than that of channel 17, in which case the second carrier frequency is at 458 MHz or it may be greater than that of channel 17 or on the order of 524 MHz. The second carrier frequency signal $F_2$, after amplitude adjustment by the adjuster 54, is summed with the first carrier frequency signal $F_1$ in the summation device 50. The combined RF signal is supplied to the non-linear RF amplifier 16. The output from the amplifier 16 takes the form as shown in FIG. 5B. It will be noted that by adding the second carrier signal $F_2$, the distortion in the adjacent sidebands 16 and 18 has been substantially reduced, such as on the order of −39 dB at a low power level on the order of 25 watts for the previous example. A comparison was made for the same amplifier when operating at 75 watts and the distortion in the sideband channels 16 and 18 was reduced from −25 dB (without the second carrier frequency signal $F_2$) to −40 dB with the second carrier signal being present. Also a test was made at 125 watts and the distortion in the sidebands was reduced to −43 dB, with the second carrier frequency signal $F_2$ being present, from −30 dB without the second carrier frequency signal $F_2$. Also a determination was made at a power level of 175 watts and the distortion in the sidebands of channels 16 and 18 was reduced to −42 dB, with the second carrier frequency signal $F_2$ present, from −34 dB with the second carrier frequency signal $F_2$ not being present. Consequently, it is seen that providing a second carrier signal $F_2$ has resulted in the reduction of the intermodulation products in the immediately adjacent RF channels. In the example given, this has been reduced by at least −37 dB throughout the operating power levels from 25 watts to 225 watts.

The reduction in the intermodulation sidebands in adjacent RF channels is a result of adding the second RF carrier frequency signal $F_2$ which "lifts" the DTV signal up out of the non-linear turn-on region 20 (FIG. 3) of the transfer curve. More specifically, as the second carrier frequency signal $F_2$ beats with the frequency signal $F_1$, of the DTV signal, the DTV signal rides up and down the transfer curve (over the non-linear "bump") at the 30 MHz beat frequency rate. This "averages out" the effect of the "bump" and the DTV performance is improved. The effect of a strong, localized non-linearity in the amplifier transfer curve (such as turn-on distortion) is mitigated by "spreading out", at a high frequency rate (30 MHz), the region of the transfer curve occupied the desired modulating envelope. The strong, localized non-linearity will still create distortion; however, this distortion will be at a much higher beat frequency (30 MHz in this example), falling well outside the assigned RF channel, where it can be easily filtered away.

The second carrier frequency signal $F_2$ and other distortion products 60, 62 and 64 falling outside of the three channel region of the assigned channel and it's two immediately adjacent channels are filtered out by output bandpass filter 56. As is indicated in FIG. 5C the bandpass actions of the filter 56 are represented by the area 66.

The results (see the waveform of FIG. 5C) may be observed with a suitable measurement meter 70, such as a spectrum analyzer located at the output of a 30 dB attenuator load. The operator may observe the results with the meter 70 while manually adjusting the adjuster 54 to achieve minimal distortion products such as that as illustrated in FIG. 5B as opposed to that in FIG. 5A.

Reference is now made to FIGS. 4A, 4B and 4C. FIG. 4A illustrates the digitally modulated RF or DTV signal 15 provided by modulator 14. FIG. 4B illustrates the second RF carrier signal 53 obtained from generator 52. Signals 15 and 53 are added together with the summation circuit 50 to produce (at the output of amplifier 16) a signal 55 which shows that the DTV signal has been lifted up and out of the non-linear turn-on portion of the transfer curve by the second RF carrier signal.

From the above description of the invention, those skilled in the art will perceive improvements, changes and modifications. Such improvements, changes and modifications within the skill of the art are intended to be covered by the appended claims.

Having described the invention, the following is claimed:

1. A digitally modulated RF amplifier system having improved adjacent sideband distortion reduction comprising:

means for providing a first RF carrier signal at a first frequency within a first channel having adjacent channels;

modulating means for receiving a digital information signal and modulating said first RF carrier signal with said digital information signal to provide a digitally modulated RF signal within said first channel;

means for providing a second RF carrier signal of a second carrier frequency spaced from said first channel by a frequency which is greater than the bandwidth, W, of said first channel;

means for additively combining said digitally modulated RF signal with said second RF carrier signal to provide a combined RF signal;

means for amplifying said combined RF signal to provide an amplified RF signal having reduced adjacent sideband distortion products; and bandpass output filter means for receiving said amplified RF signal for removing signals which are of frequencies which are outside of said first channel and its adjacent channels.

2. A system as set forth in claim 1 wherein said adjacent channels are each of a bandwidth of equal to bandwidth W.

3. A system as set forth in claim 1 wherein said second carrier frequency is spaced from said first channel by a frequency which is greater than 3 W.

4. A system as set forth in claim 1 wherein said second carrier frequency is spaced from said first channel by a frequency which is about 5 W.

5. A system as set forth in claim 1 including means for varying the magnitude of said second RF carrier signal.

6. A system as set forth in claim 5 wherein said varying means is manually adjustable.

7. A system as set forth in claim 5 wherein said adjacent channels are each of a bandwidth equal to bandwidth W.

8. A system as set forth in claim 5 wherein said second carrier frequency is spaced from said first channel by a frequency which is greater than 3 W.

9. A system as set forth in claim 5 wherein said second carrier frequency is spaced from said first channel by a frequency which is about 5 W.

10. A system as set forth in claim 5, including means for measuring the adjacent sideband distortion products while varying the magnitude of said second RF carrier signal.

11. A system as set forth in claim 1 wherein said second carrier frequency is of a frequency greater than that of said first channel.

12. A system as set forth in claim 11 wherein said adjacent channels are each of a bandwidth equal to bandwidth W.

13. A system as set forth in claim 11 wherein said second carrier frequency is spaced from said first channel by a frequency which is greater than 3 W.

14. A system as set forth in claim 11 wherein said second carrier frequency is spaced from said first channel by a frequency which is about 5 W.

15. A system as set forth in claim 1 wherein said second carrier frequency is of a frequency less than that of said first channel.

16. A system as set forth in claim 15 wherein said adjacent channels are each of a bandwidth equal to bandwidth W.

17. A system as set forth in claim 16 wherein said second carrier frequency is spaced from said first channel by a frequency which is greater than 3 W.

18. A system as set forth in claim 15 wherein said second carrier frequency is spaced from said first channel by a frequency which is about 5 W.

19. A digitally modulated RF amplifier system having improved adjacent sideband distortion reduction comprising:

a first RF carrier signal generator that provides a first RF carrier signal at a first frequency within a first channel having adjacent channels;

a modulator that receives a digital information signal and modulates said first RF carrier signal with said digital information signal to provide a digitally modulated RF signal within said first channel;

a second RF carrier signal generator that provides a second RF carrier signal of a second carrier frequency spaced from said first channel by a frequency which is greater than the bandwidth, W, of said first channel;

a combiner that additively combines said digitally modulated RF signal with said second RF carrier signal to provide a combined RF signal;

an amplifier that amplifies said combined RF signal to provide an amplified RF signal having reduced adjacent sideband distortion products; and a bandpass output filter that receives said amplified RF signal and removes signals which are of frequencies that are outside of said first channel and its adjacent channels.

20. A system as set forth in claim 19 wherein said adjacent channels are each of a bandwidth of equal to bandwidth W.

21. A system as set forth in claim 19 wherein said second carrier frequency is spaced from said first channel by a frequency which is greater than 3 W.

22. A system as set forth in claim 19 wherein said second carrier frequency is spaced from said first channel by a frequency which is about 5 W.

23. A system as set forth in claim 19 including an amplitude adjuster that varies the magnitude of said second RF carrier signal.

24. A system as set forth in claim 23 wherein said amplitude adjuster is manually adjustable.

25. A system as set forth in claim 23 wherein said adjacent channels are each of a bandwidth equal to bandwidth W.

26. A system as set forth in claim 23 wherein said second carrier frequency is spaced from said first channel by a frequency which is greater than 3 W.

27. A system as set forth in claim 23 wherein said second carrier frequency is spaced from said first channel by a frequency which is about 5 W.

28. A system as set forth in claim 23, including a measurement meter that measures the adjacent sideband distortion products while the magnitude of said second RF carrier signal is adjusted by said amplitude adjuster.

29. A system as set forth in claim 19 wherein said second carrier frequency is of a frequency greater than that of said first channel.

30. A system as set forth in claim 29 wherein said adjacent channels are each of a bandwidth equal to bandwidth W.

31. A system as set forth in claim 29 wherein said second carrier frequency is spaced from said first channel by a frequency which is greater than 3 W.

32. A system as set forth in claim 29 wherein said second carrier frequency is spaced from said first channel by a frequency which is about 5 W.

33. A system as set forth in claim 19 wherein said second carrier frequency is of a frequency less than that of said first channel.

34. A system as set forth in claim 33 wherein said adjacent channels are each of a bandwidth equal to bandwidth W.

35. A system as set forth in claim 34 wherein said second carrier frequency is spaced from said first channel by a frequency which is greater than 3 W.

36. A system as set forth in claim 33 wherein said second carrier frequency is spaced from said first channel by a frequency which is about 5 W.

* * * * *